(12) United States Patent
Zeng et al.

(10) Patent No.: US 8,677,218 B2
(45) Date of Patent: Mar. 18, 2014

(54) LDPC DECODING WITH ON THE FLY ERROR RECOVERY

(75) Inventors: Lingqi Zeng, San Jose, CA (US); Yu Kou, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 666 days.

(21) Appl. No.: 12/953,348

(22) Filed: Nov. 23, 2010

(65) Prior Publication Data

US 2011/0185264 A1    Jul. 28, 2011

Related U.S. Application Data

(60) Provisional application No. 61/336,931, filed on Jan. 27, 2010, provisional application No. 61/337,286, filed on Feb. 1, 2010.

(51) Int. Cl.
  *H03M 13/00*    (2006.01)

(52) U.S. Cl.
  USPC ............................... 714/774; 714/795

(58) Field of Classification Search
  USPC .................................. 714/774, 795
  See application file for complete search history.

(56) References Cited

U.S. PATENT DOCUMENTS

| | | | |
|---|---|---|---|
| 7,596,196 B1 | 9/2009 | Liu et al. | |
| 7,650,561 B1 * | 1/2010 | Ulriksson et al. | 714/795 |
| 8,164,846 B1 * | 4/2012 | Yang et al. | 360/25 |
| 2005/0262423 A1 | 11/2005 | Liu et al. | |
| 2007/0110188 A1 | 5/2007 | Esumi et al. | |
| 2008/0104486 A1 * | 5/2008 | Kanaoka | 714/780 |
| 2008/0276156 A1 | 11/2008 | Gunnam et al. | |
| 2008/0301521 A1 | 12/2008 | Gunnam et al. | |
| 2009/0235116 A1 * | 9/2009 | Tan et al. | 714/15 |
| 2009/0235146 A1 * | 9/2009 | Tan et al. | 714/780 |
| 2009/0268575 A1 * | 10/2009 | Tan et al. | 369/53.41 |
| 2009/0268848 A1 * | 10/2009 | Tan et al. | 375/316 |
| 2010/0042877 A1 * | 2/2010 | Tan | 714/704 |
| 2010/0229031 A1 * | 9/2010 | Tan et al. | 714/6 |

* cited by examiner

*Primary Examiner* — Joshua Lohn
(74) *Attorney, Agent, or Firm* — Van Pelt, Yi and James LLP

(57) ABSTRACT

It is decided whether to adjust data associated with a decoder. In the event it is decided to adjust the data associated with the decoder, the data is adjusted to obtain adjusted data and decoding is performed using the decoder and the adjusted data. In the event it is decided to not adjust the data associated with the decoder, decoding is performed using the decoder and the data associated with the decoder.

22 Claims, 10 Drawing Sheets

⟵ 300

Schedule driven recovery

| # of global iterations (Soft Output Viterbi Decoder) | # of local iterations (LDPC Decoder) | FIR Adjustor | Viterbi LLR Adjustor |
|---|---|---|---|
| 1 | 5 | No | No |
| 2 | 10 | No | No |
| 3 | 10 | No | Yes |
| 4 | 10 | Yes | No |

306 — row 1
308 — row 2
310 — row 3
312 — row 4

302, 304

⟵ 350

Schedule and defect detection driven recovery

| # of global iterations (Soft Output Viterbi Decoder) | # of local iterations (LDPC Decoder) | FIR Adjustor | Viterbi LLR Adjustor |
|---|---|---|---|
| 1 | 5 | No | No |
| 2 | 10 | No | No |
| 3 | 10 | No | Defer to defect detector |
| 4 | 10 | Defer to defect detector | No |

352 — row 1
354 — row 2
356 — row 3
358 — row 4

FIG. 3

Programmable Registers

| # of global iterations (Soft Output Viterbi Decoder) | # of local iterations (LDPC Decoder) | FIR Adjustor | Viterbi LLR Adjustor |
|---|---|---|---|
| 1 | $n_{local,1}$ | 00 = Yes<br>01 = No<br>10 = Defer to defect detector<br>11 = Undef. | 00 = Yes<br>01 = No<br>10 = Defer to defect detector<br>11 = Undef. |
| 2 | $n_{local,2}$ | 00 = Yes<br>01 = No<br>10 = Defer to defect detector<br>11 = Undef. | 00 = Yes<br>01 = No<br>10 = Defer to defect detector<br>11 = Undef. |
| 3 | $n_{local,3}$ | 00 = Yes<br>01 = No<br>10 = Defer to defect detector<br>11 = Undef. | 00 = Yes<br>01 = No<br>10 = Defer to defect detector<br>11 = Undef. |
| 4 | $n_{local,4}$ | 00 = Yes<br>01 = No<br>10 = Defer to defect detector<br>11 = Undef. | 00 = Yes<br>01 = No<br>10 = Defer to defect detector<br>11 = Undef. |

FIG. 4

LDPC DECODING WITH ON THE FLY ERROR RECOVERY

CROSS REFERENCE TO OTHER APPLICATIONS

This application claims priority to U.S. Provisional Patent Application No. 61/336,931 entitled LDPC DECODING WITH AUTOMATIC ERROR RECOVERY filed Jan. 27, 2010 which is incorporated herein by reference for all purposes and U.S. Provisional Patent Application No. 61/337,286 entitled PROBABILITY BASED DEFECT HANDLING IN MAGNETIC RECORDING filed Feb. 1, 2010 which is incorporated herein by reference for all purposes.

BACKGROUND OF THE INVENTION

Decoders in storage systems often do not handle noisy data and as a result decoding is often a fairly straightforward process. In some systems, a soft output Viterbi decoder performs decoding first and then a low-density parity-check (LDPC) decoder operates on the data. For most data read back from a storage system, the data can be decoded properly the first time. If the decoders fail, however, error recovery techniques must be used. Although some error recovery techniques exist, it would be desirable if new recovery techniques could be developed which are faster and/or produce better results (e.g., so a read processor can decode very noisy data that other recovery techniques are not able to properly decode).

BRIEF DESCRIPTION OF THE DRAWINGS

Various embodiments of the invention are disclosed in the following detailed description and the accompanying drawings.

FIG. 3 is a diagram showing an embodiment of schedule driven recovery and an embodiment of schedule and defect detection driven recovery.

FIG. 4 is a diagram showing an embodiment of programmable registers used to implement a table describing a schedule and/or defect detection driven recovery.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
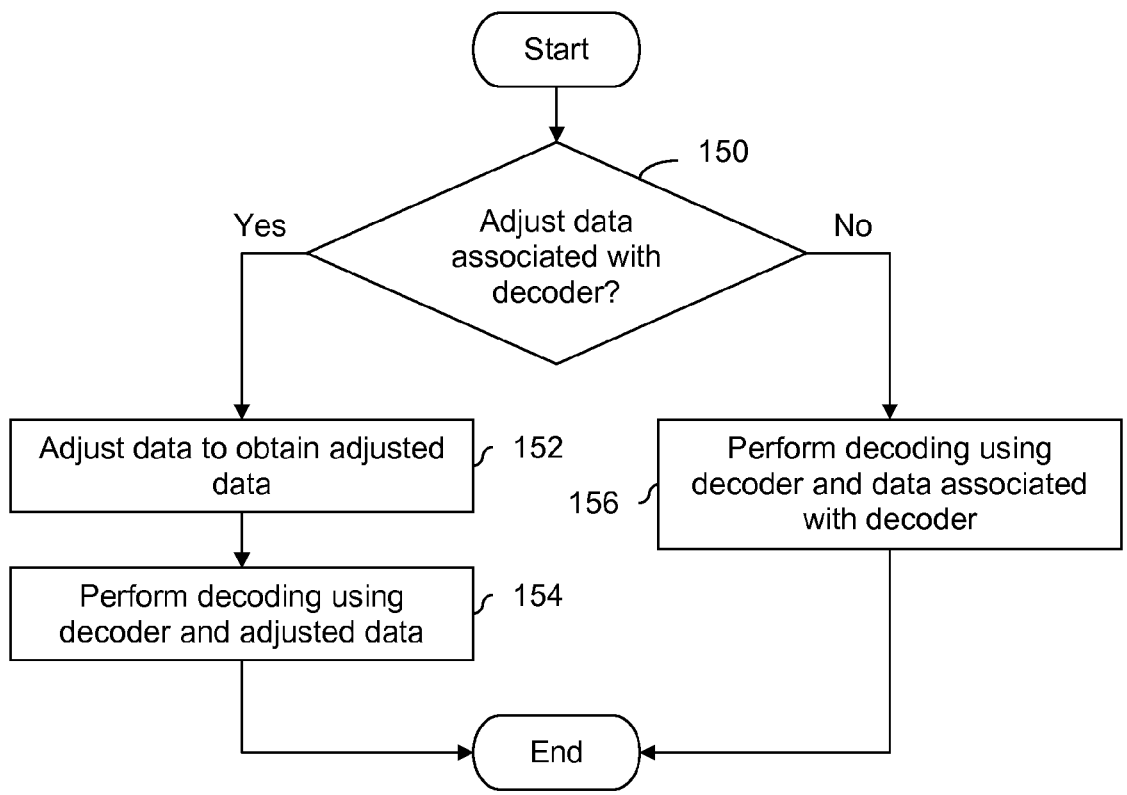
FIG. 1 is a flowchart illustrating an embodiment of an error recovery process where data associated with a decoder is adjusted if needed.

FIG. 1 is a flowchart illustrating an embodiment of an error recovery process where data associated with a decoder is adjusted if needed. In the example shown, the process is performed in the event encoded data (e.g., receive over a communications channel or read back from storage media) is unable to be successfully decoded. If, for example, data is able to be successfully decoded (e.g., on a first attempt) then the example process is not necessarily performed. In some embodiments, the technique is combined with other error recovery techniques, for example so that another error recovery technique is performed first and if that error recovery technique is not successful then this error recovery technique is performed.

At 150 it is decided whether to adjust data associated with a decoder. In some embodiments, the decoder is a soft output Viterbi decoder or a low-density parity-check (LDPC) decoder. In some embodiments, a decision at 150 is dictated by a schedule and/or a number of iterations. In some embodiments, a decision at 150 is driven by a defect detector and any adjustment is only performed when a defect is detected by the defect detector.

If it is decided to adjust data at 150 then the data is adjusted to obtain adjusted data at 152. In some embodiments, the data is an input which is fed to a decoder. In some embodiments, the data is a parameter or setting associated with the decoder and is used to perform decoding. Some examples of adjustment are described in further detail below. At 154, decoding is performed using a decoder and adjusted data. For example, decoding may be performed using the adjusted inputs and/or adjusted parameters.

If it is decided not to adjust data at 150 then decoding is performed using a decoder and the data associated with decoder at 156. In some embodiments, initial decoding iterations are performed using unmodified decoder inputs and/or decoder parameters and if the decoder is still unsuccessful (e.g., because the noise is quite bad and the system is having a difficult time performing decoding) then the system begins adjusting decoder inputs and/or parameters.

Figure 2A:
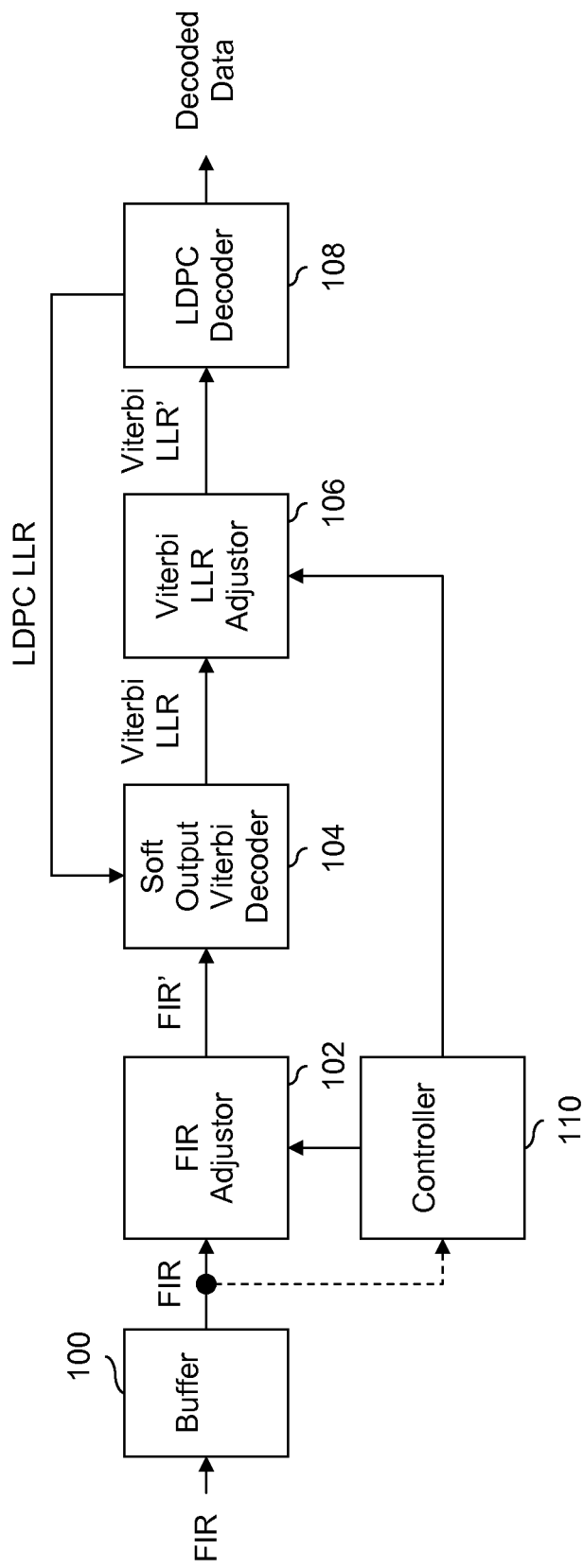
FIG. 2A is a diagram showing an embodiment of a system configured to perform error recovery, including by adjusting information where appropriate.

FIG. 2A is a diagram showing an embodiment of a system configured to perform error recovery, including by adjusting information where appropriate. In some embodiments, the system shown in FIG. 2A is part of a read processor that accesses and processes encoded data stored on storage media, such as (magnetic) disk drive media. In some embodiments, the system shown in FIG. 2A is part of a receiver (e.g., the receiving half of a transceiver).

A finite impulse response (FIR) signal is received at buffer 100. Buffer 100 stores a copy of the FIR data and passes it to FIR adjustor 102 and controller 110. FIR adjustor 102 is configured to either let the FIR signal pass through unmodified or modifies the FIR signal received from buffer 100. In this example, the first time an FIR signal is processed, FIR adjustor 102 is off and makes no changes to the FIR signal and passes it along to soft output Viterbi decoder 104 unmodified.

The times or instances at which modification is performed and/or the specific modification performed on the received FIR signal is controlled by controller 110. In this example, controller 110 controls FIR adjustor 102 and/or Viterbi LLR adjustor 106, e.g., by determining whether to turn on an associated adjustment in those blocks. In some embodiments, controller 110 has a schedule and follows the schedule in determining when to turn on adjustors 102 and/or 106. In some embodiments, controller 110 decides based on the FIR signal received from buffer 100 whether to turn on adjustor 102 and/or 106. In some embodiments, controller 110 is controlled by an array of configuration registers (e.g., regarding whether to use a schedule versus a defect detector is in controlling adjustors 102 and/or 106).

Soft output Viterbi decoder 104 processes the received FIR signal from FIR adjustor 102. As described previously, this may be a modified version or an unmodified version. Soft output Viterbi decoder 104 outputs a Viterbi log likelihood ratio (LLR). An LLR, in general, is a representation or estimate of how sure a decoder is that a particular bit (or symbol) is a particular value. LLR will range from a −x to x where −x indicates the detector is 100% certain the received bit is a 0 (or a 1, depending upon how the LLR equation is defined) and an x indicates that the detector is 100% certain the received bit is a 1 (or a 0 in some systems). An LLR value of 0 indicates the decoder is split in its decision and is leaning neither one way nor the other. This state may be referred to as an erasure since downstream processors may treat this similar to an erasure where the system did not read anything from the storage media.

Viterbi LLR adjustor 106 either passes the received Viterbi LLR through unmodified or modifies it based on the control signal coming from controller 110. In either case, the modified or unmodified LLR is passed to LDPC decoder 108. The control signals passed to FIR adjustor 102 and Viterbi LLR adjustor 106 are independent in this example and therefore they may both be on, one may be on while the other is off, etc. Put another way, the times or instances at which adjustors 102 and 106 are on are not necessarily coupled.

LDPC decoder 108 performs LDPC decoding and if successful outputs decoded data. For example, in a storage system, the decoded data may be passed to an application or other entity which requested that a read operation be performed. If LDPC decoder 108 is unsuccessful in performing decoding, the LDPC decoder makes one or more additional attempts until some maximum is reached. In some embodiments, a system includes an array of configuration registers and one of these configuration registers controls or otherwise sets the maximum number of times LDPC decoder attempts to decode the data. In some applications it is desirable to use configuration registers (e.g., as opposed to hard coding how the system operates). In one example, the system shown in FIG. 2A is implemented on a single semiconductor chip, such as a field-programmable gate array (FPGA) or an application-specific integrated circuit (ASIC), which is purchased by a storage system manufacturer as a component for their storage system. The storage system manufacture may prefer to purchase semiconductor chips which are configurable so the system manufacturer does not have to tell the FPGA or ASIC vendor how to build the chip, thus permitting the system manufacturer to keep its settings secret.

Once any maximum is reached and if proper decoding has not been achieved, decoding passes to FIR adjustor 102. In this example, LDPC decoder 108 reaching a maximum number of attempts is an opportunity for FIR adjustor 102 to be turned off/on by controller 110 if desired.

With FIR adjustor 102 configured as desired (e.g., if desired, FIR adjustor 102 can be configured to adjust an FIR signal where previously the FIR signal was permitted to pass through unmodified or vice versa), soft output Viterbi decoder 104 attempts to decode the data one more time using an FIR signal which may or may not be modified. This second or higher attempt by soft output Viterbi decoder 104 to decode the data is referred to as on the fly recovery because the system uses the signal stored in buffer 100 to retry the decoding, as opposed to going back to storage and re-reading data from the storage media. On the fly recovery may be faster than re-reading the storage for some types of storage media. In the case of a disk drive system, for example, it may take as long as 11 ms for the disk to rotate back to the correct angular position and for the read arm to be in position over the proper part of the disk. During this time the system may be able to perform many retries, possibly resulting in successful decoding of the data all before the data can be re-read from storage.

Figure 2B:
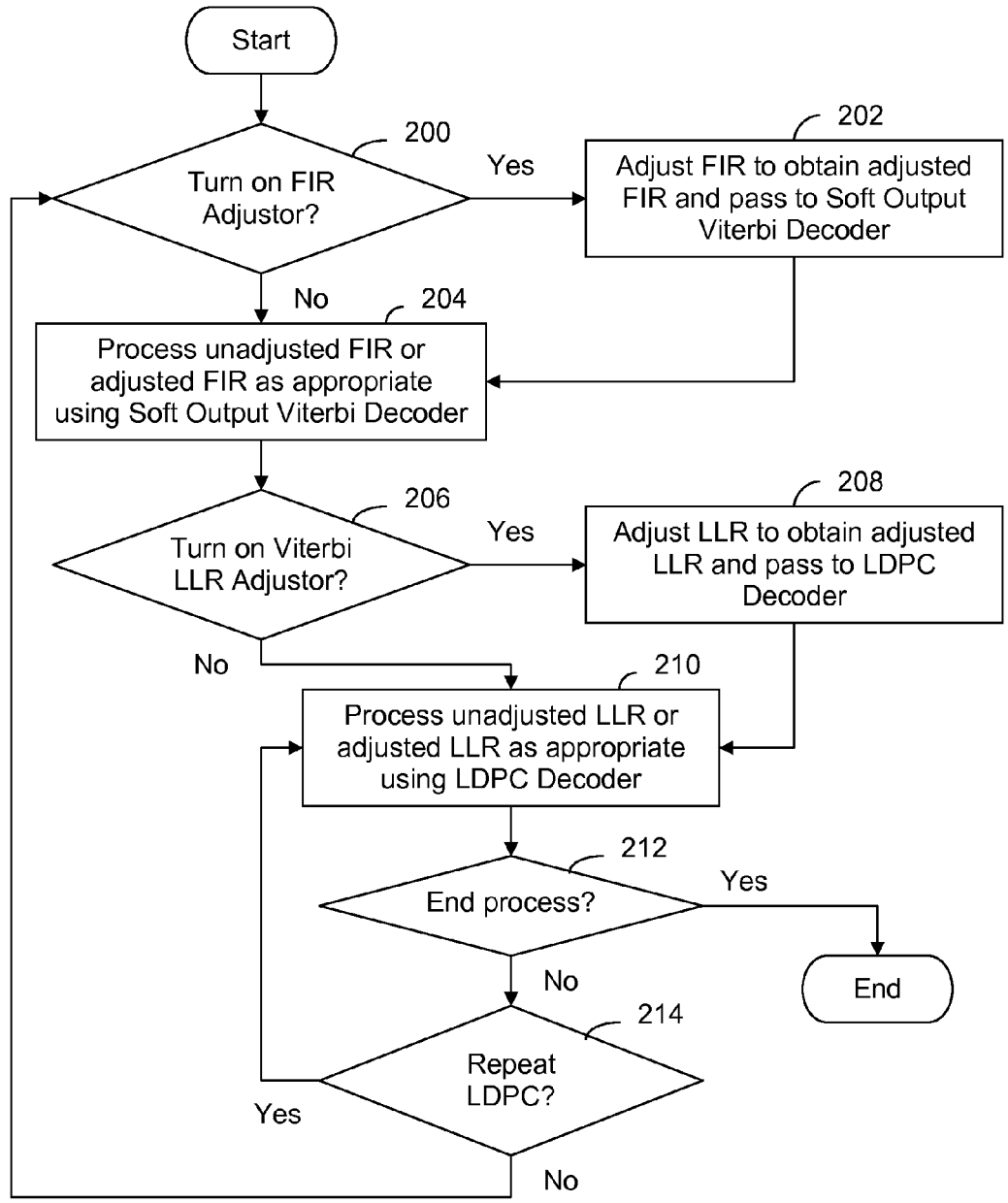
FIG. 2B is a flowchart illustrating an embodiment of a process for performing on the fly recovery, including by adjusting decoding information where appropriate.

FIG. 2B is a flowchart illustrating an embodiment of a process for performing on the fly recovery, including by adjusting decoding information where appropriate. In the example shown, the process shown corresponds to the system shown in FIG. 2A.

At 200 it is decided whether to turn on an FIR adjustor. In some embodiments, a controller tracks a number iterations (e.g., performed by a soft output Viterbi decoder and/or an LDPC decoder) and decides whether to turn on an FIR adjustor according to a schedule of iterations. In some embodiments, a controller uses a defect detector in making this decision. For example, if a defect detector included in a controller finds a defect or a specific type of defect, then the controller decides to turn on the FIR adjustor.

In some embodiments where a controller uses a defect detector, it is decided to turn on an FIR adjustor when a shallow defect occurs. One example of a shallow defect is a defect where the signal is reduced slightly in magnitude such that the extreme high magnitudes are not observed in the signal. In some embodiments, a shallow defect is detected by tracking high(est) magnitudes. In one example, a defect detector tracks when the two highest magnitudes are received. A counter is reset any time two highest magnitudes are received. If the counter reaches a certain value (i.e., without being reset) then that portion of the signal is flagged as being a defect. Then the average magnitude (say A) of all those highest magnitudes within the defect region is computed and compared with the average normal magnitude (say B). One way to compare is to divide A by B. if the ratio is larger than certain pre-defined threshold, say 50%, then the defect is a shallow defect.

If it is decided at 200 to turn on an FIR adjustor then at 202 an FIR is adjusted to obtain an adjusted FIR and it is passed to a soft output Viterbi decoder. In some embodiments, an FIR adjustor is configured to restore the FIR signal within the defect area to its normal magnitude. For example, if the ratio of the defect is 50%, then the magnitudes of the FIR signal will be multiplied by 2 to match the average normal magnitude.

After adjusting at 202 or if it is decided at 200 to not turn on an FIR adjustor, the unadjusted FIR or adjusted FIR is processed as appropriate using the soft output Viterbi decoder at 204. For example, the soft output Viterbi decoder performs decoding and outputs an LLR signal (sometimes referred to herein as a Viterbi LLR to distinguish it from an LLR output by an LDPC).

At 206 it is decided whether to turn on a Viterbi LLR adjustor. In some embodiments, a controller decides whether to turn on a Viterbi LLR adjustor according to a schedule and/or using a defect detector as described above (e.g., as dictated by an array of programmable registers). In some embodiments where a controller uses a defect detector, it is decided to turn on a Viterbi LLR adjustor when a deep defect is detected by a defect detector. A deep defect may occur as a result of defective magnetic particles on the storage media which cannot be magnetized properly. Regardless of what causes a deep defect, a deep defect is characterized by a signal that has little or no relation to the written signal. Some examples of deep defects are described in further detail below. In some embodiments, a Viterbi LLR adjustor is configured to adjust those LLR values corresponding to a deep defect portion to an LLR value corresponding to an erasure (e.g., by setting the LLR to 0, which causes downstream processors to treat that piece of data as an erasure or a piece of data for which the detector is split 50-50 on the value of the piece of data). In some embodiments, setting an LLR to 0 for a deep defect portion is attractive because the deep defect portion (and information resulting from processing of that portion) is not an accurate or proper reflection of the data that was stored there and setting the LLR to 0 causes downstream processors to give little or no weight to this part of the signal.

In some embodiments, an LLR adjustor is configured to reduce the magnitude but preserve the sign of an LLR for those LLR values corresponding to a detected defect portion. For example, if an LLR ranges from −15 to 15 and an unmodified LLR is −13 then an example modified LLR is −10. In some embodiments a linear relationship is used which preserves the sign and reduces the magnitude such as: modified LLR=($\alpha$×unmodified LLR) where $0<\alpha<1$. In various embodiments, a lookup table, stair step function, etc. may be used to adjust an LLR. In some embodiments, preserving the sign but reducing the magnitude of an LLR for those LLR values corresponding to a defect portion is desirable because downstream processors will still know which value a detector believes the data to be (i.e., because this is represented in the sign) but how certain or sure the detector is in that decision (e.g., whether a piece of data is actually a 0 or 1) has been downgraded or reduced. A detector operates assuming there is no degradation in the signal read back and that is not the case for a shallow defect portion.

If it is decided at 206 to turn on a Viterbi LLR adjustor then at 208 an LLR is adjusted to obtain an adjusted LLR which is passed to an LDPC decoder. After adjusting at 208 or if it is decided at 206 to not turn on a Viterbi LLR adjustor, an unadjusted LLR or adjusted LLR is processed as appropriate using an LDPC decoder at 210. For example, the LDPC decoder performs decoding using the (un)adjusted LLR values passed to it; the decoding may or may not be successful.

At 212 it is decided whether the process ends. In one example, the process ends if an LDPC decoder is able to successfully decode the data. In another example, a controller keeps track of iterations (e.g., performed by an LDPC decoder and/or a soft output Viterbi decoder) and if a maximum number of iterations is reached and successful decoding has not been achieved then the process ends. In some embodiments, if such a maximum is reached, a requesting entity such as an application is informed the data is unavailable or unreadable.

If it is decided not to end the process at 212 then at 214 it is decided whether to repeat an LDPC. In some embodiments, if an LDPC is unsuccessful in decoding, LDPC decoding is attempted before having the soft output Viterbi decoder re-attempt decoding. In some embodiments, such a consecutive number of attempts (if needed) is called a number of local iterations and this number is programmable via a register. For example, if such a register is set to 5, then the LDPC will try to decode the data up to 5 successive times if needed (i.e., if the LDPC decoder fails in decoding 5 times in a row).

If it is decided to repeat LDPC processing at 214 then an unadjusted LLR or adjusted LLR is processed as appropriate using an LDPC decoder at 210. In this example, the same settings of the soft output Viterbi decoder and LDPC decoder are used during successive decoding attempts by the LDPC decoder. Put another way, during consecutive LDPC decoding attempts, a controller (in this embodiment at least) does not change the settings of FIR adjustor or Viterbi LLR adjustor. If it is decided to not repeat LDPC processing at 214 (e.g., because a maximum number of location iterations has been reached and the LDPC is still not successful) then it is decided whether to turn on an FIR adjustor at 200. In this example, now that any consecutive LDPC attempts are over, the FIR and/or Viterbi LLR adjustor may be switched on/off as desired.

For clarity, the examples shown herein are shown without pipelining or parallel/out of order processing. In some embodiments, pipelining or parallel/out of order processing is used to improve throughput. In such embodiments, one portion of the system may be working on one piece of data while another portion of the system is simultaneously working on another piece of data.

FIG. 3 is a diagram showing an embodiment of schedule driven recovery and an embodiment of schedule and defect detection driven recovery. In the example shown, table 300 shows a schedule used by a controller to decide when to turn on/off an FIR adjustor and a Viterbi LLR adjustor and table 350 shows a schedule which includes when to use a defect detector to decide whether to turn on an adjustor. The sequence of operations shown in tables 300 and 350 indicate when a controller turns off/on adjustors in its control so long as the decoders are unsuccessful. Should the decoders be successful, the process ends and the controller goes back to the beginning of the table for the next piece of data to be decoded.

Table 300 shows settings for 4 global iterations (i.e., rows 306-312), each global iteration of which corresponds to a number of local iterations. A global iteration corresponds to a decoding attempt (e.g., a single attempt) by a soft output Viterbi decoder and an LDPC decoder. As described above, a number of local iterations is a number of times an LDPC decoder successively attempts to decode a piece of data. Referring back to FIG. 2B, this may be the number of times 210 is performed in a row (e.g., without a soft output Viterbi decoder taking over).

Column 302 shows the settings for an FIR adjustor and column 304 shows the settings for a Viterbi LLR adjustor.

According to the setting shown in table 300, during the first attempt by the soft output Viterbi decoder and the first 5 attempts by the LDPC decoder (i.e., row 306), the FIR adjustor and Viterbi LLR adjustor are off. That is, the FIR adjustor and Viterbi LLR adjustor during these attempts will pass the FIR and Viterbi LLR (respectively) through unmodified. Values shown in tables 300 and 350 are merely exemplary and any setting and/or number of global/local iterations may be used. Similarly, during the second attempt by a soft output Viterbi decoder and the $6^{th}$ thru $15^{th}$ (overall) attempts by an LDPC decoder (corresponding to row 308) the FIR adjustor and Viterbi LLR adjustor remain off and no modification or adjustment is performed. During the next batch of iterations (corresponding to row 310), the Viterbi LLR adjustor is turned on (i.e., the input Viterbi LLR values are modified and adjusted Viterbi LLR values are output) while the FIR adjustor remains off. In some embodiments, an adjustor setting of Yes means that the corresponding adjustor adjusts all values that are input to it during that time. For example, the FIR adjustor will adjust all FIR values passed to it and the Viterbi LLR adjustor will adjust all Viterbi LLR values passed to it. In the fourth batch of iterations (corresponding to row 312), the Viterbi LLR adjustor is turned off while the FIR adjustor is turned on. In various embodiments, various adjustments are performed by the FIR adjustor and/or Viterbi LLR adjustor when turned on. In some embodiments, a scaling is performed where the sign is preserved and the magnitude is decreased. In some embodiments, an FIR or LLR is zeroed out.

Table 350 shows recovery which is driven by a schedule as well as a defect detector. Rows 352 and 354 are similar to rows 306 and 308 shown in table 300. Row 356 corresponds to the $3^{rd}$ global iteration of a soft output Viterbi decoder and the $16^{th}$ thru $25^{th}$ (overall) attempts by an LDPC decoder. During this time, an FIR adjustor is off but a Viterbi LLR adjustor operates as dictated or otherwise specified by a defect detector. For example, if the defect detector during the iterations corresponding to row 356 does not detect any defect then the FIR adjustor does not adjust any of the FIR values during that time. Conversely, if a defect detector detects a defect then some or all of the FIR values are adjusted. In some such embodiments, only those FIR values for which a defect is detected are adjusted. Row 358 corresponds to the next batch of iterations during which the FIR adjustor is controlled by the defect detector and the Viterbi LLR adjustor is off.

In some embodiments, a control signal passed from a controller (which includes a defect detector) to an adjustor (such as an FIR adjustor or a Viterbi LLR adjustor) includes the location (if any) at which a defect occurs. In some embodiments, such a control signal includes a description of the defect, such a pre-defined type of defect. In one example, the control signal includes a one-bit type signal where a 0 indicates a shallow defect and a 1 indicates a deep defect. In some other embodiments, an estimate of the (average) magnitude of the defective portion is provided by the controller to an adjustor and the magnitude is used to in adjusting an FIR or Viterbi LLR (e.g., by reducing the magnitude of an LLR by a corresponding amount or degree).

FIG. 4 is a diagram showing an embodiment of programmable registers used to implement a table describing a schedule and/or defect detection driven recovery. In some embodiments, tables 300 or 350 shown in FIG. 3 are implemented using the programmable registers shown in table 400. Using programmable or configurable registers as shown may be desirable because this enables a storage system manufacturer to configure the chip as desired without revealing a system's preferred configuration.

In column 402, 2-bit registers are used for the FIR adjustor settings. For example, one 2-bit register is used for the FIR adjustor setting corresponding to the $1^{st}$ global iteration, another 2-bit register is used for the FIR adjustor setting corresponding to the $2^{nd}$ global iteration, etc. Similarly, 2-bit registers are used for each of the Viterbi LLR adjustor settings corresponding to a group of iterations shown in column 404. For example, 2-bit register is used for the Viterbi LLR adjustor setting corresponding to the $1^{St}$ global iteration, another 2-bit register is used for the Viterbi LLR adjustor setting corresponding to the $2^{nd}$ global iteration and so on. In this example a value of 00 corresponds to Yes, a value of 01 corresponds to a No, a value of 10 corresponds to deferring to a defect detector (i.e., adjust some or all of the data if the defect detector detects a defect, otherwise no adjustment) and 11 is undefined.

In various embodiments, any number of bits may be used for the number of local iterations associated with an LDPC decoder in column 406. In some embodiments, the number of bits is selected based on an expected maximum number of iterations. For example, a simulation may be run with a signal containing "worst case" noise or per a storage system manufacturer's requirements and an expected maximum number of iterations is calculated based on the simulation.

Figure 5:
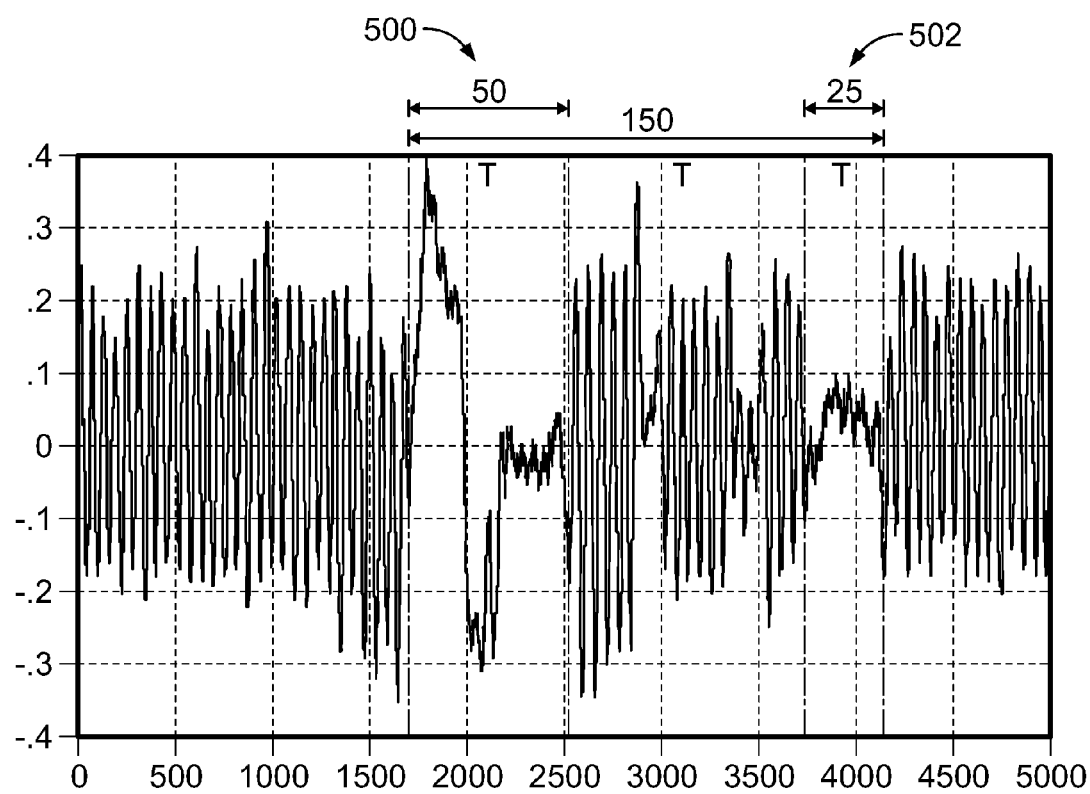
FIG. 5 is a waveform showing an embodiment of a deep defect.

FIG. 5 is a waveform showing an embodiment of a deep defect. In the example shown, signal portions 500 and 502 are examples of a deep defect. In some embodiments, a controller includes a defect detector and the detection of any deep defects causes a Viterbi LLR adjustor to be turned off/on according to what the defect detector finds. In both deep defect examples, the signal read back for those locations have little to no similarity to the original signal which was written (not shown). In the first example, deep defect portion 500 begins with a signal that begins high (e.g., in the range of approximately ~0.4 thru ~0.2), goes low (e.g., ~−0.25) and then goes to a value near zero. In the second example, deep defect portion 502 has a value that stays near zero.

In some embodiments, a defect detector is configured to detect deep defects (such as 500 and 502) using an average magnitude. For example, the average magnitude of portion 500 is lower than the average magnitude of the signal outside of portions 500 and 502. In some embodiments, a defect detector is configured to detect an average magnitude over a sliding window; this average magnitude is compared against a threshold to detect a shallow defect.

In some applications, a storage system is a perpendicular recording system where information is stored perpendicularly (e.g., vertically with respect to the plane of a disk) as opposed to laterally (e.g., within the plane of a disk). In such systems, if the read back FIR signal has large positive values (or large negative values) for a very long run, then the resulting LLR signals (not shown) will correspond to run of 1's or 0's (depending upon the polarity of the magnetization). For example, the beginning part of deep defect portion 500 may correspond to an LLR signal having a run of 1's (0's) and the middle part of deep defect portion 500 may correspond to an LLR signal having a run of 0's (1's). If the signal read back is close to zero for a prolonged period of time then the FIR signal may correspond to a Nyquist pattern (e.g., 10101010 . . . ). For example, the ending part of deep defect portion 500 and deep defect portion 502 may result in an LLR signal having the Nyquist pattern.

Figure 6:
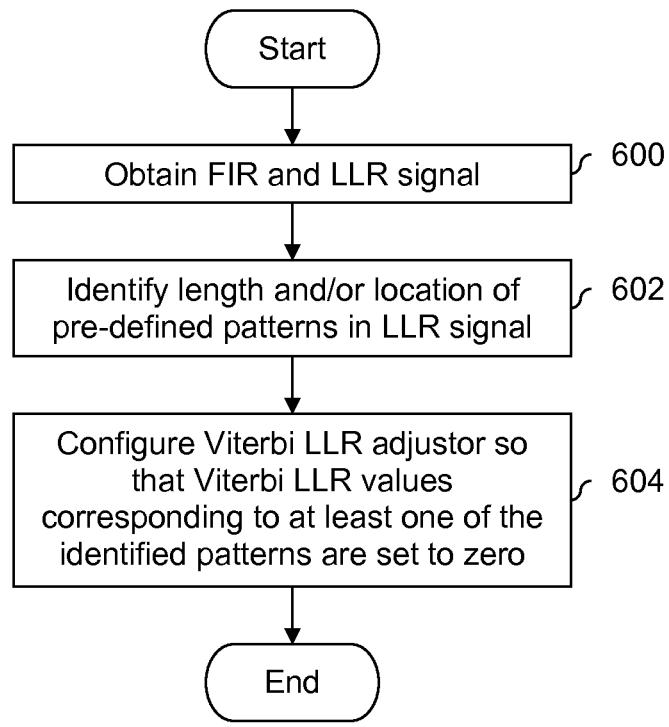
FIG. 6 is a flowchart illustrating an embodiment of a process for detecting deep defects and responses to the detected deep defects.

FIG. 6 is a flowchart illustrating an embodiment of a process for detecting deep defects and responses to the detected deep defects. In some embodiments, controller 110 in FIG. 2A includes a defect detector and controller 110 performs the process shown herein.

At 600 an FIR signal and an LLR signal is obtained. For example, in FIG. 2A controller 110 obtains an FIR and LLR signal from buffer 100. The locations of pre-defined patterns in an LLR signal are identified at 602. For example, the pre-defined patterns may include a run of 0's, a run of 1's and the Nyquist pattern and locations of those patterns are identified. At 604, a Viterbi LLR adjustor is configured so that Viterbi LLR values corresponding to at least one of the identified patterns are set to zero. For example, controller 110 in FIG. 2A may signal to Viterbi LLR adjustor 106 the location(s) of at least one of the detected deep defects so that the corresponding Viterbi LLR values can be zeroed out.

In some embodiments, step 604 includes sorting a list of identified locations based on length. In some such embodiments, Viterbi LLR values corresponding to the location with the longest pre-defined pattern is first adjusted (i.e., and parts of the signal corresponding to other, shorter pre-defined patterns are not adjusted at least for this decoding attempt). For example, referring back to FIG. 5, deep defect portion 500 has a longer length (50) than deep defect portion 502 (25). In embodiments configured to prioritize based on defect length, the Viterbi LLR values corresponding to deep defect portion 500 are adjusted (e.g., set to 0) during earlier attempt(s) whereas the Viterbi LLR values corresponding to deep defect portion 502 are not adjusted. If the decoders are unable to properly decode the data then both Viterbi LLR values corresponding to deep defect portions 500 and 502 may both be adjusted (e.g., by setting them to 0). In some embodiments, this occurs during the same global iteration. For example, referring to both FIGS. 3 and 5, during the $3^{rd}$ global iteration and the $16^{th}$ overall local iteration (row 356), Viterbi LLR values for portion 500 in FIG. 5 are adjusted but Viterbi LLR values for portion 502 in FIG. 5 are not adjusted. Should decoding fail, during the $3^{rd}$ global iteration and the $17^{th}$ overall local iteration (also row 356), Viterbi LLR values for portion 500 in FIG. 5 are adjusted as are the Viterbi LLR values for portion 502. Conversely, in some embodiments, any adjustment to Viterbi LLR values remains the same across all local iterations in a given global iteration.

Figure 7:
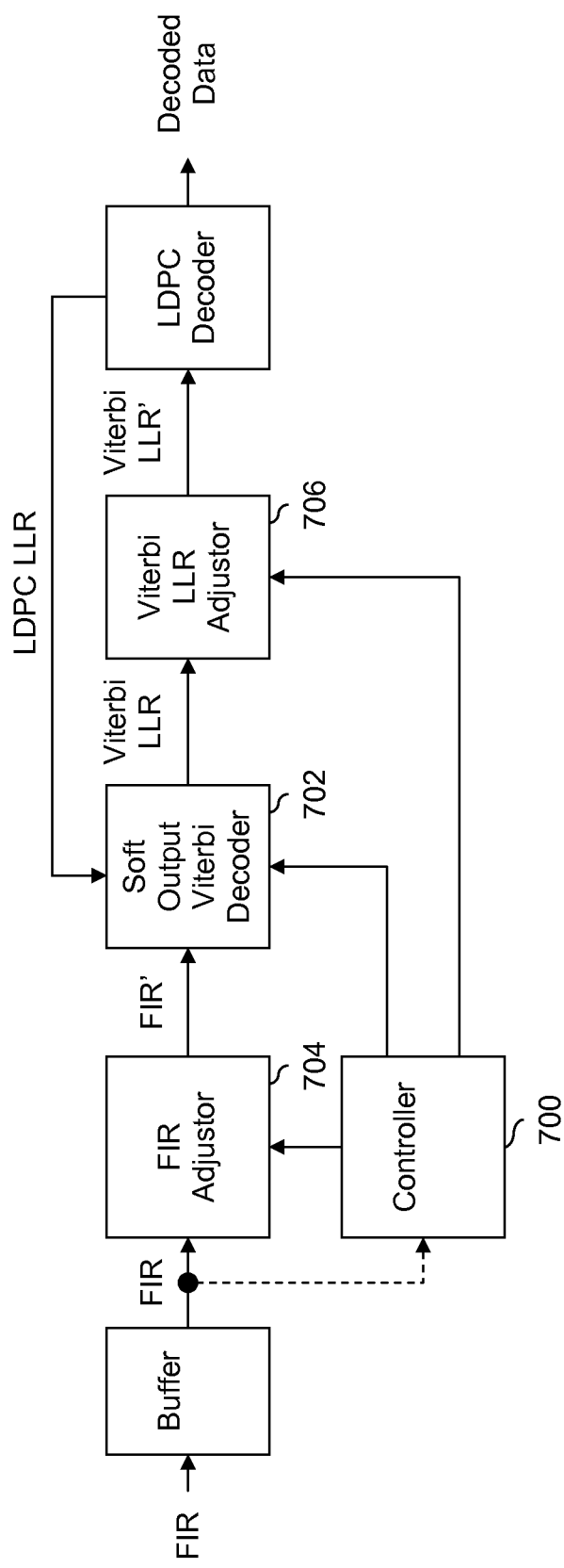
FIG. 7 is a diagram showing an embodiment of a system configured to perform error recovery, including by adjusting parameters associated with a soft output Viterbi decoder.

FIG. 7 is a diagram showing an embodiment of a system configured to perform error recovery, including by adjusting parameters associated with a soft output Viterbi decoder. Although this example shows controller 700 controlling FIR adjustor 704, soft output Viterbi decoder 702 and Viterbi LLR adjustor 706, the technique shown herein may be used in any combination. For example, adjustment of parameters associated with a soft output Viterbi decoder may be performed alone (e.g., because a system includes no FIR adjustor and no Viterbi LLR adjustor or those components are included but are not turned on).

Controller 700 adjusts parameters used in Viterbi decoding processing performed by soft output Viterbi decoder 702. For example, the control signal passed from controller 700 to Viterbi decoder 702 includes parameters and those parameters are used during decoding by Viterbi decoder 702. As described above, in various embodiments a schedule and/or defect detector may be used in deciding when to adjust parameters associated with a soft output Viterbi decoder and array of registers may be used to control this.

Figure 8:
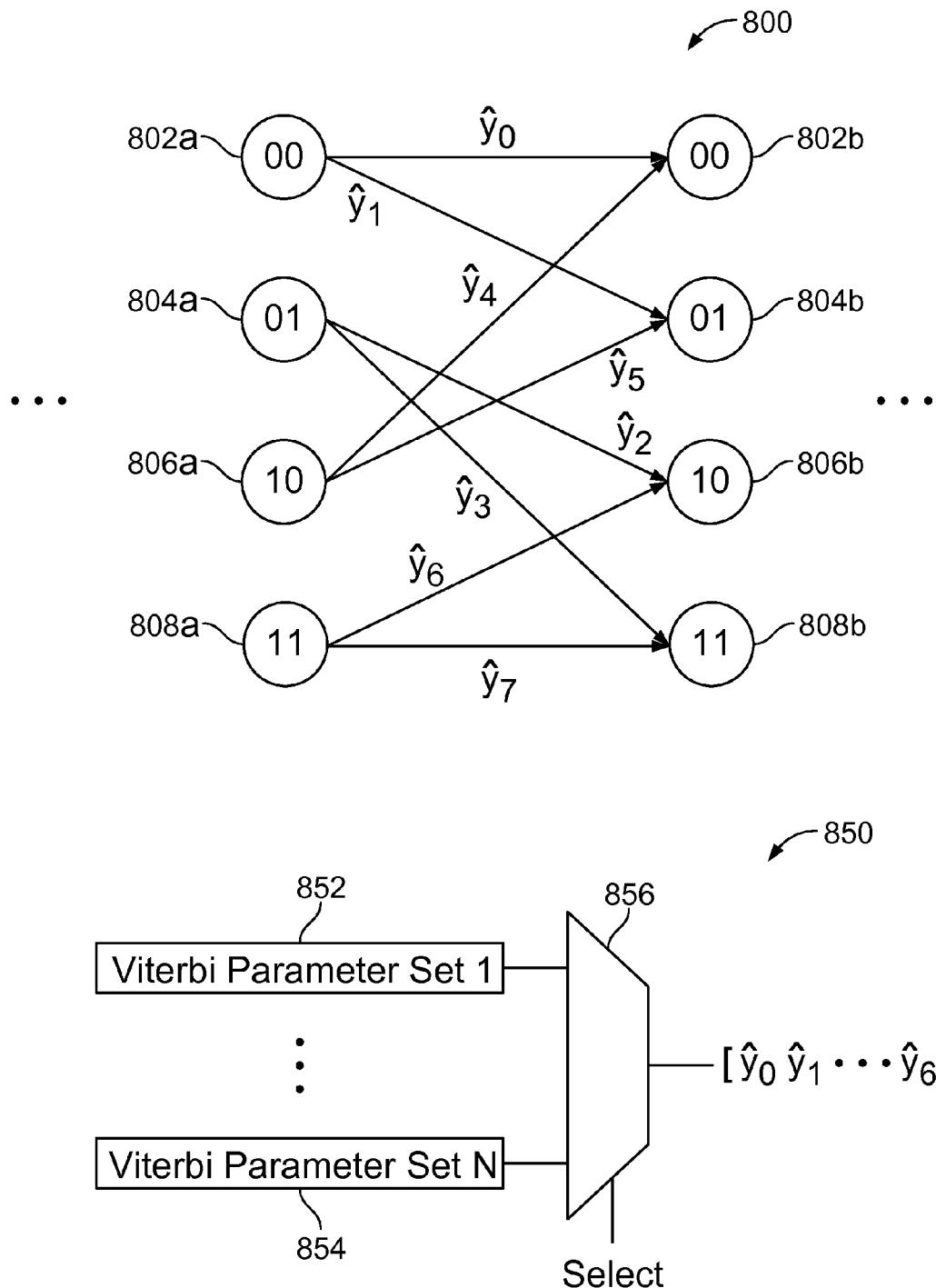
FIG. 8 is a diagram illustrating an embodiment of parameters associated with a soft output Viterbi decoder which are adjusted if needed.

FIG. 8 is a diagram illustrating an embodiment of parameters associated with a soft output Viterbi decoder which are adjusted if needed. The number of nodes and transitions shown are merely exemplary and any number of nodes and/or transitions may be used.

In diagram 800, a portion of a Viterbi trellis is shown. States 802a-808a are the possible beginning states and states 802b-808b are the possible ending states. Each of beginning states 802a-808a has two possible transitions. For example, when in state 802a (corresponding to 00) the permitted transitions are to state 802b (e.g., because the input=0 causes the beginning state 00 to go 00) or to state 804b (e.g., because the input=1 causes the beginning state of 00 to go to 01). Similarly, the permitted transitions from state 804a are to state 806b (e.g., because the input=0 causes the beginning state to go from 01 to 10) and state 808b (e.g., because the input=1 causes the beginning state to go from 01 to 11).

Each of the possible transitions (e.g., from state 802a to state 802b, from state 802a to state 804b, etc.) is associated with a parameter, shown in diagram 800 as $\hat{y}_0, \hat{y}_1, \ldots, \hat{y}_6, \hat{y}_7$. These parameters are referred to as branch values and are used to calculate errors which in turn are used to calculate a path through the trellis which results in a decision by the soft output Viterbi decoder. In some embodiments, these parameters are adjusted in the event decoding fails one or more times. Adjusting parameters associated with a soft output Viterbi decoder as shown causes the decoder to output different Viterbi LLR values and/or different decisions (e.g., a previously negative LLR value is during a later repeat decided instead to be positive, indicating the decoder has changed its mind regarding whether a corresponding bit is a 0 or a 1).

Diagram 850 shows a diagram of an embodiment in which parameters associated with a soft output Viterbi decoder are adjusted. In the example shown, N sets of Viterbi parameters are stored. In some embodiments, Viterbi parameter sets 852 thru 854 are implemented as registers which are programmable (e.g., by a driver). Multiplexer 856 selects one of the parameter sets to output as parameters $\hat{y}_0, \hat{y}_1, \ldots, \hat{y}_6, \hat{y}_7$. For example, the select input of multiplexer 856 may be controlled by controller 700 in FIG. 7, registers 852 thru 854 and multiplexer 856 are included in soft output Viterbi decoder 702 and the output of multiplexer 856 is used by soft output Viterbi decoder 702 during decoding processing.

Figure 9:
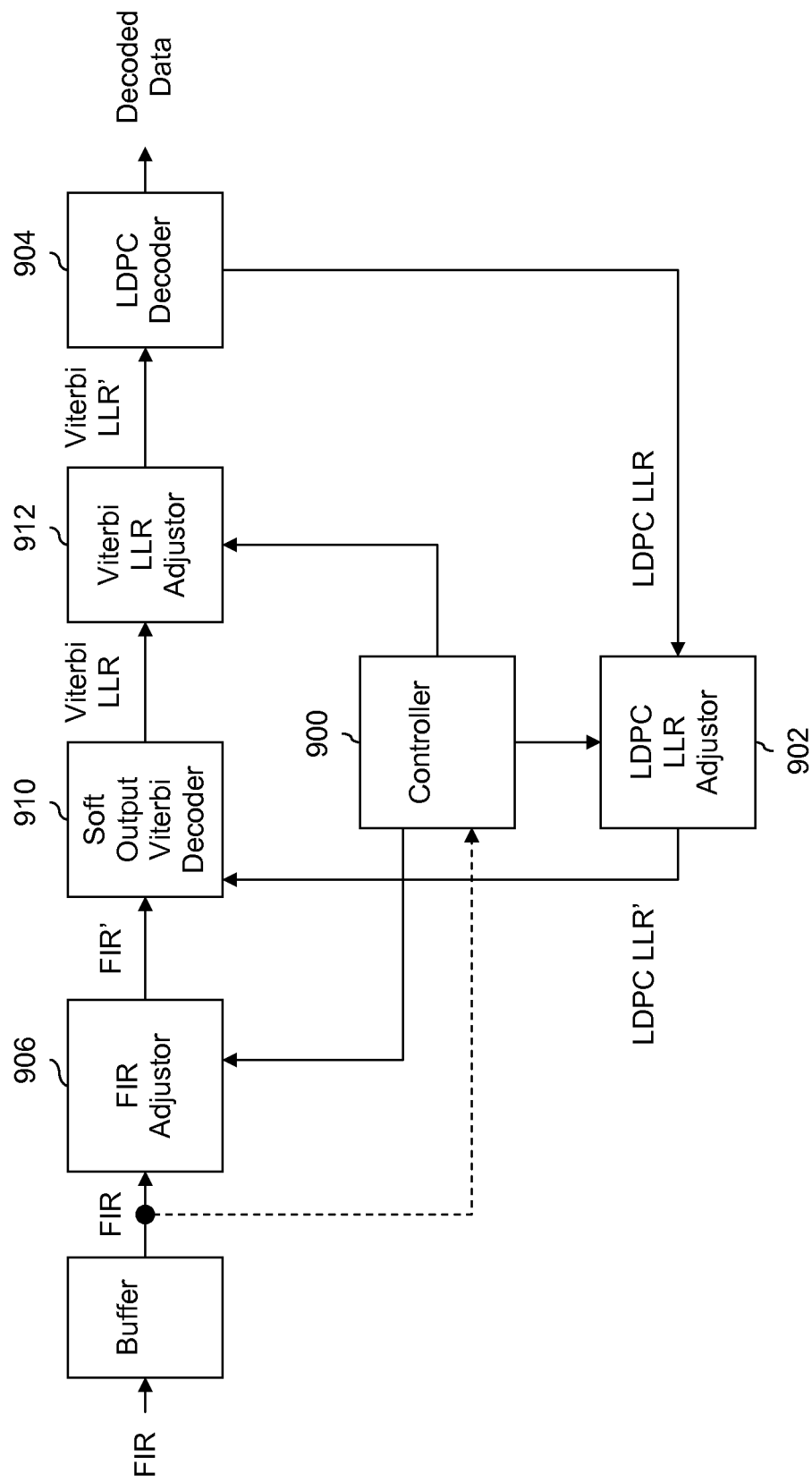
FIG. 9 is a diagram showing an embodiment of a system configured to perform error recovery, including by adjusting an LLR signal output by an LDPC.

FIG. 9 is a diagram showing an embodiment of a system configured to perform error recovery, including by adjusting an LLR signal output by an LDPC. Although this example shows LDPC LLR adjustor 900 in combination with FIR adjustor 906 and Viterbi LLR adjustor 912, in various embodiments, LDPC LLR adjustment can be used in any combination (e.g., alone, in combination with adjustment of one or more parameters associated with a soft output Viterbi decoder, etc.). In this example, LDPC LLR adjustor 900 is configured to adjust (as needed or as directed) LDPC LLR levels output by LDPC decoder 904. The LDPC LLR values passed to SOVA 910 by adjustor 902 in some cases are adjusted and in other cases are not adjusted; this is controlled by controller 900.

The LDPC LLR values are used in the event decoding is handed off from LDPC decoder 904 to soft output Viterbi decoder 910 (e.g., when changing from global iteration 1 to 2, from 2 to 3, etc.). If the data is relatively noise-free so that decoding is performed successfully the first time it is attempted then the LDPC LLR signal is not used.

In some embodiments, the FIR signal within deep defect region is not trustable at all and the LDPC LLR within this deep defect region is more reliable. In the $2^{nd}$ global iteration and so on, SOVA will use both FIR signal and LDPC LLR to re-compute the Viterbi LLR. Thus, we may want to weight more on LDPC LLR in SOVA computation. That is, we could choose to use LDPC LLR adjustor to amplify the reliability of the LDPC LLR within the deep defect region by multiplying a number larger than 1, e.g., 1.2.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
deciding whether to adjust data associated with a decoder, wherein:
deciding whether to adjust the data associated with the decoder includes one or more of the following: using a schedule, using a defect detector configured to detect defects using a finite impulse response (FIR) signal, or using a set of one or more programmable registers; and
the defect detector is configured to detect deep defects based at least in part on one or more of the following: a run of 0's, a run of 1's or a Nyquist pattern;
in the event it is decided to adjust the data associated with the decoder:
adjusting the data to obtain adjusted data, including by:
sorting, based on length, a list which includes any detected runs of 0's, any detected runs of 1's and any detected Nyquist patterns;
during a first iteration:
(1) adjusting data corresponding to that defect in the sorted list having the longest length; and
(2) not adjusting data corresponding to all other defects, if any, in the sorted list; and
during a second iteration subsequent to the first iteration:
(1) adjusting data corresponding to those defects in the sorted list having the longest length and the second longest length; and
(2) not adjusting data corresponding to all other defects, if any, in the sorted list; and
performing decoding using the decoder and the adjusted data; and
in the event it is decided to not adjust the data associated with the decoder, performing decoding using the decoder and the data associated with the decoder.

2. The method of claim 1, further comprising buffering a finite impulse response (FIR) signal, wherein adjusting the data, performing decoding using the adjusted data and performing decoding using the data associated with the decoder include using the buffered FIR signal.

3. The method of claim 1, wherein the decoder includes a soft output Viterbi decoder and the data associated with the decoder includes a finite impulse response (FIR) signal.

4. The method of claim 1, wherein the decoder includes a low-density parity-check (LDPC) decoder and the data associated with the decoder includes a log likelihood ratio (LLR) signal output by a soft output Viterbi decoder.

5. The method of claim 1, wherein the decoder includes a soft output Viterbi decoder and the data associated with the decoder includes one or more parameters associated with the soft output Viterbi decoder.

6. The method of claim 1, wherein the decoder includes a soft output Viterbi decoder and the data associated with the decoder includes a log likelihood ratio (LLR) signal output by a low-density parity-check (LDPC) decoder.

7. The method of claim 1, wherein the defect detector is further configured to detect defects associated with an amplitude defect.

8. The method of claim 1, wherein adjusting the data includes one or more of the following: preserving a sign and reducing a magnitude or zeroing out a value.

9. A system, comprising:
a controller configured to decide whether to adjust data associated with a decoder, wherein:
the controller is configured to decide whether to adjust the data associated with the decoder using one or more of the following: using a schedule, using a defect detector configured to detect defects using a finite impulse response (FIR) signal, or using a set of one or more programmable registers; and
the defect detector is configured to detect deep defects based at least in part on one or more of the following: a run of 0's, a run of 1's or a Nyquist pattern;
a signal processor configured to in the event it is decided to adjust the data associated with the decoder, adjust the data to obtain adjusted data, including by:
sorting, based on length, a list which includes any detected runs of 0's, any detected runs of 1's and any detected Nyquist patterns;
during a first iteration:
(1) adjusting data corresponding to that defect in the sorted list having the longest length; and
(2) not adjusting data corresponding to all other defects, if any, in the sorted list; and
during a second iteration subsequent to the first iteration:
(1) adjusting data corresponding to those defects in the sorted list having the longest length and the second longest length; and
(2) not adjusting data corresponding to all other defects, if any, in the sorted list; and
a decoder configured to:
in the event it is decided to adjust the data associated with the decoder, perform decoding using the adjusted data; and
in the event it is decided to not adjust the data associated with the decoder, performing decoding using the data associated with the decoder.

10. The system of claim 9, further comprising a buffer configured to buffer a finite impulse response (FIR) signal, wherein the signal processor is configured to adjust the data and the decoder is configured to perform decoding using the adjusted data and perform decoding using the data associated with the decoder by using the buffered FIR signal.

11. The system of claim 9, wherein the decoder includes a soft output Viterbi decoder and the data associated with the decoder includes a finite impulse response (FIR) signal.

12. The system of claim 9, wherein the decoder includes a low-density parity-check (LDPC) decoder and the data associated with the decoder includes a log likelihood ratio (LLR) signal output by a soft output Viterbi decoder.

13. The system of claim 9, wherein the decoder includes a soft output Viterbi decoder and the data associated with the decoder includes one or more parameters associated with the soft output Viterbi decoder.

14. The system of claim 9, wherein the decoder includes a soft output Viterbi decoder and the data associated with the decoder includes a log likelihood ratio (LLR) signal output by a low-density parity-check (LDPC) decoder.

15. The system of claim 9, wherein the defect detector is further configured to detect defects associated with an amplitude defect.

16. The system of claim 9, wherein the signal processor is configured to adjust the data by one or more of the following: preserving a sign and reducing a magnitude or zeroing out a value.

17. A computer program product, the computer program product being embodied in a non-transitory computer readable storage medium and comprising computer instructions for:
deciding whether to adjust data associated with a decoder, wherein:

deciding whether to adjust the data associated with the decoder includes one or more of the following: using a schedule, using a defect detector configured to detect defects using a finite impulse response (FIR) signal, or using a set of one or more programmable registers; and the defect detector is configured to detect deep defects based at least in part on one or more of the following: a run of 0's, a run of 1's or a Nyquist pattern;

in the event it is decided to adjust the data associated with the decoder:

adjusting the data to obtain adjusted data, including by:
sorting, based on length, a list which includes any detected runs of 0's, any detected runs of 1's and any detected Nyquist patterns;

during a first iteration:
(1) adjusting data corresponding to that defect in the sorted list having the longest length; and
(2) not adjusting data corresponding to all other defects, if any, in the sorted list; and during a second iteration subsequent to the first iteration:
(1) adjusting data corresponding to those defects in the sorted list having the longest length and the second longest length; and
(2) not adjusting data corresponding to all other defects, if any, in the sorted list; and performing decoding using the decoder and the adjusted data; and in the event it is decided to not adjust the data associated with the decoder, performing decoding using the decoder and the data associated with the decoder.

18. The computer program product of claim 17, wherein the decoder includes a soft output Viterbi decoder and the data associated with the decoder includes a finite impulse response (FIR) signal.

19. The computer program product of claim 17, wherein the decoder includes a low-density parity-check (LDPC) decoder and the data associated with the decoder includes a log likelihood ratio (LLR) signal output by a soft output Viterbi decoder.

20. The computer program product of claim 17, wherein the decoder includes a soft output Viterbi decoder and the data associated with the decoder includes one or more parameters associated with the soft output Viterbi decoder.

21. The computer program product of claim 17, wherein the decoder includes a soft output Viterbi decoder and the data associated with the decoder includes a log likelihood ratio (LLR) signal output by a low-density parity-check (LDPC) decoder.

22. The computer program product of claim 17, wherein the computer instructions for adjusting the data include computer instructions for one or more of the following: preserving a sign and reducing a magnitude or zeroing out a value.

* * * * *